United States Patent
Ko et al.

(10) Patent No.: US 10,504,660 B2
(45) Date of Patent: Dec. 10, 2019

(54) SENSITIZING DYE SOLUTION, WORKING ELECTRODE FOR DYE-SENSITIZED SOLAR CELL PREPARED USING THE SENSITIZING DYE SOLUTION AND DYE-SENSITIZED SOLAR CELL INCLUDING THE WORKING ELECTRODE

(71) Applicant: KOREA INSTITUTE OF SCIENCE AND TECHNOLOGY, Seoul (KR)

(72) Inventors: Min Jae Ko, Seoul (KR); Bong Soo Kim, Seoul (KR); Jin Young Kim, Seoul (KR); Hong Gon Kim, Seoul (KR); Hae Jung Son, Seoul (KR); Doh-Kwon Lee, Seoul (KR); Jin Ah Lee, Seoul (KR); Hee Suk Jung, Seoul (KR); Hwa Young Jin, Seoul (KR)

(73) Assignee: Korean Institute of Science and Technology, Seoul (KR)

( * ) Notice: Subject to any disclaimer, the term of this patent is extended or adjusted under 35 U.S.C. 154(b) by 790 days.

(21) Appl. No.: 14/511,656

(22) Filed: Oct. 10, 2014

(65) Prior Publication Data

US 2015/0371787 A1    Dec. 24, 2015

(30) Foreign Application Priority Data

Jun. 18, 2014    (KR) .......................... 10-2014-0074201

(51) Int. Cl.
*H01G 9/20*    (2006.01)
*H01L 51/00*   (2006.01)

(52) U.S. Cl.
CPC ....... *H01G 9/2059* (2013.01); *H01L 51/0086* (2013.01); *H01G 9/2031* (2013.01); *Y02E 10/542* (2013.01); *Y02E 10/549* (2013.01)

(58) Field of Classification Search
CPC . Y02E 10/542; H01L 51/005; H01L 51/0086; H01L 51/422; H01L 51/4226; H01G 9/2031; H01G 9/2059
See application file for complete search history.

(56) References Cited

U.S. PATENT DOCUMENTS

2010/0213455 A1* 8/2010 James .................... B82Y 10/00
                                                    257/40
2015/0380171 A1* 12/2015 Osada ..................... C09B 57/10
                                                    252/500

FOREIGN PATENT DOCUMENTS

KR    20120061627 A  *  6/2012
KR    101207603 A      11/2012
(Continued)

OTHER PUBLICATIONS

Machine translation of KR20120061627, Rhee et al. (Year: 2012).*
(Continued)

*Primary Examiner* — Mayla Gonzalez Ramos
(74) *Attorney, Agent, or Firm* — Goldilocks Zone IP Law

(57)  ABSTRACT

Disclosed is a method for adsorbing a dye for a dye-sensitized solar cell. The method includes: coating a paste including metal oxide nanoparticles on the upper surface of a titanium oxide thin film and calcining the coated paste to form a porous film; adding an additive to a sensitizing dye solution to promote the adsorption of the dye; and dipping the porous film in the sensitizing dye solution to adsorb the sensitizing dye onto the surface of the porous film. The sensitizing dye solution is a dispersion of the sensitizing dye in an organic solvent. Also disclosed are a working electrode prepared using the sensitizing dye solution and a dye-sensitized solar cell including the working electrode. The addition of the additive shortens the time of dye adsorption. Despite the shortened adsorption time, the dye does not undergo desorption in the long term as well as in the short term, ensuring long-term stability of the solar cell.

22 Claims, 3 Drawing Sheets

(56) References Cited

FOREIGN PATENT DOCUMENTS

| KR | 101207603 B1 | * | 12/2012 |
| KR | 101369731 A | | 2/2014 |
| KR | 1020140013162 A | | 2/2014 |

OTHER PUBLICATIONS

Boeun Kim, et al; "Rapid Dye Adsorption via Surface Modification of $TiO_2$ Photoanodes for Dye-Sensitized Solar Cells", Applied Materials & Interfaces, vol. 5, pp. 5201-5207; Published May 16, 2013.

Hyunwoong Seo, et al; "Faster dye-adsorption of dye-sensitized solar cells by applying an electric field", Electrochimica Acta, vol. 55, pp. 4120-4123; Available online Mar. 1, 2010.

* cited by examiner

SENSITIZING DYE SOLUTION, WORKING ELECTRODE FOR DYE-SENSITIZED SOLAR CELL PREPARED USING THE SENSITIZING DYE SOLUTION AND DYE-SENSITIZED SOLAR CELL INCLUDING THE WORKING ELECTRODE

CROSS-REFERENCE TO RELATED APPLICATIONS

This application claims priority under 35 U.S.C. § 119 to Korean Patent Application No. 10-2014-0074201 filed on Jun. 18, 2014 in the Korean Intellectual Property Office, the disclosure of which is incorporated herein by reference in its entirety.

BACKGROUND OF THE INVENTION

1. Field of the Invention

The present invention relates to a sensitizing dye solution, a working electrode for a dye-sensitized solar cell prepared using the sensitizing dye solution, and a dye-sensitized solar cell including the working electrode.

2. Description of the Related Art

In recent years, fossil fuels have been depleted and environmental pollution has been issued as a serious problem. Under such circumstances, next generation energy development has gained increasing importance. Particularly, solar cells for directly converting solar energy emitted from sunlight into electrical energy produce less pollution, utilize the inexhaustible energy resource, and can be used semi-permanently. Due to these advantages, solar cells are expected as future energy sources.

Solar cells are broadly classified into inorganic solar cells, dye-sensitized solar cells, and organic solar cells by the kind of material that they employ. Most inorganic solar cells use single crystalline silicon. Single crystal silicon solar cells can be advantageously fabricated in the form of thin films but suffer from the problems of high cost and poor stability.

Dye-sensitized solar cells are photoelectrochemical solar cells and a prototype thereof was first presented by Grätzel et al., Switzerland, in 1991. Dye-sensitized solar cells require no junction at all, unlike p-n junction solar cells as general types of solar cells.

Such a dye-sensitized solar cell includes a working electrode covered with porous $TiO_2$, a counter electrode covered with platinum, and an electrolyte located between the two electrodes and through which ions migrate. A sensitizing dye capable of absorbing visible light is adsorbed onto the working electrode to create electron-hole pairs.

The dye excites electrons, the excited electrons reach the counter electrode through the $TiO_2$ particles of the working electrode, and redox reactions proceed in the electrolyte to operate the dye-sensitized solar cell.

Dye-sensitized solar cells are fabricated in a simple and economical manner and have high energy conversion efficiency compared to silicon solar cells. Due to these advantages, dye-sensitized solar cells have attracted much attention as promising next generation replacements for existing silicon solar cells.

The energy conversion efficiency of dye-sensitized solar cells using liquid electrolytes was reported to be about 12% in 2011. Dyes creating electron-hole pairs need to be adsorbed. However, this process is very time consuming and is thus an obstacle to the commercialization of dye-sensitized solar cells.

There is thus a need for a working electrode in which a dye is fast adsorbed and does not undergo desorption despite the shortened adsorption time to guarantee long-term stability and high efficiency of a solar cell, and a dye-sensitized solar cell using the working electrode.

PRIOR ART DOCUMENTS

Patent Documents

Korean Patent Application No. 10-2012-0078839

Non-Patent Documents

Electrochimica Acta, Vol. 55, Issue 13, 4120-4123, 2010
ACS Appl. Mater. Interfaces, 2013, 5, 5201-5207

SUMMARY OF THE INVENTION

The present invention is intended to provide a sensitizing dye solution for the preparation of a working electrode of a dye-sensitized solar cell which includes a dye undergoing fast adsorption onto the surface of a porous film and can guarantee long-term stability of the solar cell despite the shortened adsorption time, a working electrode for a dye-sensitized solar cell prepared using the sensitizing dye solution, and a dye-sensitized solar cell including the working electrode.

One aspect of the present invention provides a sensitizing dye solution for the preparation of a working electrode of a dye-sensitized solar cell, including a sensitizing dye, an organic solvent, and an additive wherein the additive is (i) a first additive selected from diphenylammonium trifluoromethanesulfonate (DPAT), pentafluoroanilinium triflate (PFPAT), pentafluorophenylammonium trifluoromethanesulfonate, N-(trimethylsilyl)bis(trifluoromethanesulfonyl)imide, 4-methylbenzenesulfonic acid, (7,7-dimethyl-2-oxo-bicyclo[2,2,1]-hept-1-yl)methanesulfonic acid, and mixtures of two or more thereof, (ii) a second additive selected from hydrochloric acid, sulfuric acid, phosphoric acid, acetic acid, nitric acid, and mixtures of two or more thereof, or (iii) a mixture of the first additive and the second additive.

Another aspect of the present invention provides a method for preparing a working electrode of a dye-sensitized solar cell, including (C) bringing the sensitizing dye solution into contact with a porous substrate wherein the porous substrate includes a titanium oxide thin film and a 10 nm to 30 μm thick porous film formed on the upper surface of the titanium oxide thin film.

Another aspect of the present invention provides a method for preparing a working electrode of a dye-sensitized solar cell, including (B) forming a porous film on the upper surface of a titanium oxide thin film formed on a transparent conductive substrate to obtain a porous substrate, and (C) bringing the sensitizing dye solution into contact with the porous substrate.

Another aspect of the present invention provides a method for preparing a working electrode of a dye-sensitized solar cell, including (A) forming a titanium oxide thin film on a transparent conductive substrate, (B) fainting a porous film on the upper surface of the titanium oxide thin film to obtain a porous substrate, and (C) bringing the sensitizing dye solution into contact with the porous substrate.

Another aspect of the present invention provides a working electrode for a dye-sensitized solar cell prepared by the method according to any one of the foregoing aspects.

Yet another aspect of the present invention provides a dye-sensitized solar cell including (a) a working electrode prepared by the method according to any one of the foregoing aspects, (b) a counter electrode arranged to face the working electrode and including a catalyst layer, and (c) an electrolyte filled between the working electrode and the counter electrode.

When working electrodes are prepared by the methods according to the aspects and embodiments of the present invention, the adsorption reaction between a sensitizing dye and titanium oxide is very fast, and as a result, the overall processing time can be considerably shortened. The working electrodes thus prepared exhibit high dye adsorption rates and adsorption intensities in the short term, achieving high solar cell efficiencies, and exhibit low dye desorption rates in the long term, achieving improved long-term stability of solar cells, in comparison with working electrodes prepared by conventional methods.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
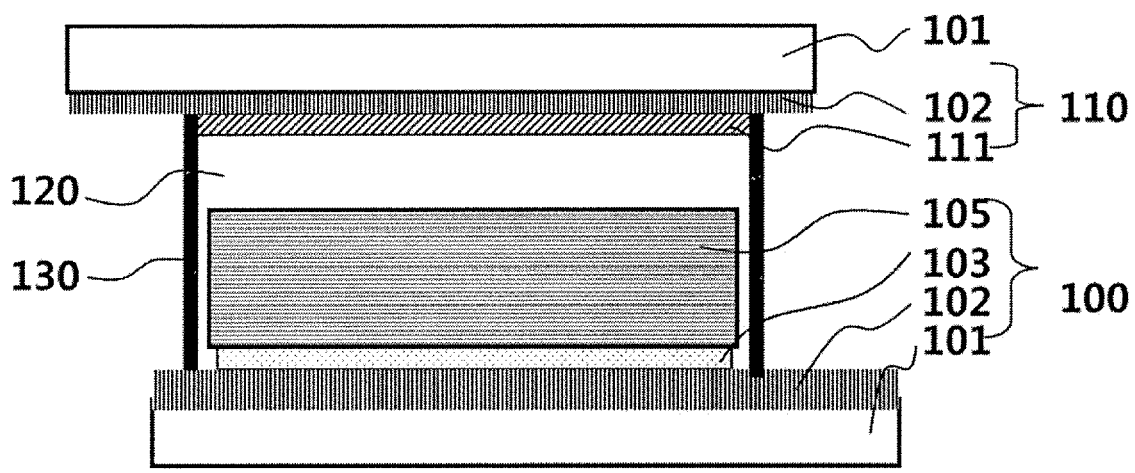
FIG. 1 is a cross-sectional view of a dye-sensitized solar cell including a working electrode according to one embodiment of the present invention.

Various aspects and embodiments of the present invention will now be discussed in more detail.

One aspect of the present invention is directed to a sensitizing dye solution for the preparation of a working electrode of a dye-sensitized solar cell, including a sensitizing dye, an organic solvent, and an additive.

The additive may be a first additive selected from diphenylammonium trifluoromethanesulfonate (DPAT), pentafluoroanilinium triflate (PFPAT), pentafluorophenylammonium trifluoromethanesulfonate, N-(trimethylsilyl)bis(trifluoromethanesulfonyl)imide, 4-methylbenzenesulfonic acid, (7,7-dimethyl-2-oxobicyclo[2,2,1]-hept-1-yl)methanesulfonic acid, and mixtures of two or more thereof.

The additive may be a second additive selected from hydrochloric acid, sulfuric acid, phosphoric acid, acetic acid, nitric acid, and mixtures of two or more thereof.

The additive may be a mixture of the first additive and the second additive.

The present inventors found that the use of the additive improves the rate of adsorption of the sensitizing dye to titanium oxide.

Particularly, the first additive may be used alone. In this case, it is preferred that the content of the first additive in the solution is from 1.5 to 10 moles, more preferably from 1.8 to 5 moles, based on one mole of the sensitizing dye.

A lower rate of desorption of the dye is achieved when the first additive is present in an amount of less than 1.5 moles or exceeding 10 moles per mole of the sensitizing dye than when the additive is absent, leading to a further improvement in stability. When the additive is used in an amount ranging from 1.5 to 10 moles, this stability improvement is more pronounced and, particularly, no change in the rate of desorption of the dye is caused even after operation at 50° C. or higher for 300 hours, resulting in a marked improvement in high-temperature long-term stability.

Particularly, the use of diphenylammonium trifluoromethanesulfonate (DPAT) or pentafluoroanilinium triflate (PFPAT) as the additive leads to a relatively high adsorption intensity of the dye. In addition, the use of diphenylammonium trifluoromethanesulfonate (DPAT) or pentafluoroanilinium triflate (PFPAT) considerably increases the initial rate of adsorption of the dye compared to the use of the above-exemplified first additive other than DPAT and PFPAT, the second additive, or a mixture thereof.

A mixture of diphenylammonium trifluoromethanesulfonate (DPAT) and pentafluoroanilinium triflate (PFPAT) in a weight ratio of 1-99:99-1 may be used as the additive. In this case, the use of the additive enables the fabrication of solar cells with almost the same performance despite changes in various processing conditions, achieving considerably improved performance uniformity of the final devices.

The second additive may be used alone. In this case, it is preferred that the content of the second additive in the solution is from 1.5 to 10 moles, more preferably 1.8 to 5 moles, based on one mole of the sensitizing dye.

A lower rate of desorption of the dye is achieved when the second additive is present in an amount of less than 1.5 moles or exceeding 10 moles per mole of the sensitizing dye than when the additive is absent, leading to a further improvement in stability. When the additive is used in an amount ranging from 1.5 to 10 moles, this stability improvement is more pronounced and, particularly, no change in the rate of desorption of the dye is caused even after operation at 50° C. or higher for 300 hours, resulting in a marked improvement in high-temperature long-term stability.

Alternatively, a mixture of the first additive and the second additive may be used. In this case, it is preferred that the contents of the first additive and the second additive in the solution are from 1.5 to 10 moles and from 1.5 to 10 moles, respectively, based on one mole of the sensitizing dye. The molar ratio of the first additive to the second additive is preferably from 99.9:0.1 to 0.1:99.9, particularly preferably from 99:1 to 80:20.

A lower rate of desorption of the dye is achieved when the first additive and the second additive are present outside the preferred ranges defined above than when the additives are absent, leading to a further improvement in stability. When the contents of the first additive and the second additive are within the ranges defined above, this stability improvement is more pronounced and, particularly, no change in the rate of desorption of the dye is caused even after operation at 50° C. or higher for 300 hours, resulting in a marked improvement in high-temperature long-term stability.

In another embodiment, the sensitizing dye has a band gap of 1.55 to 3.1 eV.

In another embodiment, the sensitizing dye is selected from an organic-inorganic complex dye including a metal or metal complex, an organic dye, and a mixture thereof.

The organic-inorganic complex dye may be selected from ruthenium (Ru) complex dyes, osmium (Os) complex dyes, platinum (Pt) complex dyes, copper (Cu) complex dyes, porphyrin complex dyes, phthalocyanine complex dyes, and mixtures of two or more thereof.

The organic dye may be selected from coumarin-based organic dyes, indoline-based organic dyes, carbazole-based organic dyes, triarylamine-based organic dyes, perylene-based organic dyes, hemicyanine-based organic dyes, squaraine-based organic dyes, and mixtures of two or more thereof.

In another embodiment, the organic solvent is selected from ethanol, acetonitrile, tetrahydrofuran, dimethyl chloride, and mixtures of two or more thereof.

A further aspect of the present invention is directed to a method for preparing a working electrode of a dye-sensitized solar cell, including (C) bringing the sensitizing dye solution into contact with a porous substrate.

The porous substrate may have a structure in which a 10 nm to 30 μm thick porous film is formed on the upper surface of a titanium oxide thin film.

Another aspect of the present invention is directed to a method for preparing a working electrode of a dye-sensitized solar cell, including (B) forming a porous film on the upper surface of a titanium oxide thin film formed on a transparent conductive substrate to obtain a porous substrate, and (C) bringing the sensitizing dye solution into contact with the porous substrate.

Another aspect of the present invention is directed to a method for preparing a working electrode of a dye-sensitized solar cell, including (A) forming a titanium oxide thin film on a transparent conductive substrate, (B) forming a porous film on the upper surface of the titanium oxide thin film to obtain a porous substrate, and (C) bringing the sensitizing dye solution into contact with the porous substrate.

In one embodiment, step (A) is carried out by (i) coating a titanium oxide precursor on a transparent conductive substrate, followed by heat treatment, or (ii) forming a conductive film on one surface of a transparent substrate, coating a titanium oxide precursor on the conductive film, followed by heat treatment.

In a further embodiment, the heat treatment is performed at 100 to 600° C.

In another embodiment, the titanium oxide thin film is from 50 to 250 nm in thickness.

In another embodiment, step (B) is carried out by coating a paste including metal oxide nanoparticles on the upper surface of the titanium oxide thin film and calcining the coated paste.

In another embodiment, the metal oxide may be selected from tin (Sn) oxide, antimony (Sb) oxide, niobium (Nb) oxide, fluorine-doped tin (Sn) oxide, indium (In) oxide, tin-doped indium (In) oxide, zinc (Zn) oxide, aluminum (Al) oxide, boron (B) oxide, gallium (Ga) oxide, hydrogen (H) oxide, yttrium (Y) oxide, titanium (Ti) oxide, silicon (Si)-doped zinc (Zn) oxide, tin (Sn)-doped zinc (Zn) oxide, magnesium (Mg) oxide, cadmium (Cd) oxide, magnesium zinc (MgZn) oxide, indium zinc (InZn) oxide, copper aluminum (CuAl) oxide, silver (Ag) oxide, zinc tin oxide (ZnSnO), zinc indium tin (ZIS) oxide, nickel (Ni) oxide, rhodium (Rh) oxide, ruthenium (Ru) oxide, iridium (Ir) oxide, copper (Cu) oxide, cobalt (Co) oxide, tungsten (W) oxide, zirconium (Zr) oxide, strontium (Sr) oxide, lanthanum (La) oxide, vanadium (V) oxide, molybdenum (Mo) oxide, scandium (Sc) oxide, samarium (Sm) oxide, strontium titanium (SrTi) oxide, and mixtures of two or more thereof.

In another embodiment, the metal oxide nanoparticles have an average particle diameter of 10 to 100 nm.

In another embodiment, the paste further includes a binder and a solvent.

In another embodiment, the calcination is performed at 100 to 600° C. for 30 to 200 minutes.

In another embodiment, the porous film has a thickness of 10 nm to 30 μm.

In another embodiment, step (C) is carried out by (i) dipping the porous substrate in the sensitizing dye solution, (ii) spraying the sensitizing dye solution on the porous substrate, or (iii) dropping the sensitizing dye solution onto the porous substrate.

In another embodiment, the porous film is dipped in the sensitizing dye solution at 30 to 50° C. for 1 to 180 minutes.

Another aspect of the present invention is directed to a working electrode for a dye-sensitized solar cell prepared by the method according to any one of the foregoing embodiments.

Yet another aspect of the present invention is directed to a dye-sensitized solar cell including (a) a working electrode prepared by the method according to any one of the foregoing embodiments, (b) a counter electrode arranged to face the working electrode and including a catalyst layer, and (c) an electrolyte filled between the working electrode and the counter electrode.

It will be understood that when an element is referred to as being "on" or "on the upper surface of" another element, it can be directly on the other element or intervening elements may be present therebetween. In contrast, when an element is referred to as being "directly on" another element, there are no intervening elements present.

The terminology used herein is for the purpose of describing particular embodiments only and is not intended to be limiting of the invention. As used herein, the terms "includes" and/or "including" or "comprises" and/or "comprising" specify the presence of stated features, regions, integers, steps, operations, elements, and/or components, but do not preclude the presence or addition of one or more other features, regions, integers, steps, operations, elements, components, and/or groups thereof.

The term 'nano' described herein means a nanoscale and is also intended to include a microscale. The term 'nanoparticles' includes all types of nanoscale particles.

Some embodiments of the present invention will be described in detail with reference to FIGS. 1 and 2.

According to the present invention, a method for adsorbing a dye for a dye-sensitized solar cell is provided which includes (a) coating a paste including metal oxide nanoparticles on the upper surface of a titanium oxide thin film and calcining the coated paste to form a porous film, (b) adding an additive to a sensitizing dye solution to promote the adsorption of the dye, and (c) dipping the porous film in the sensitizing dye solution to adsorb the sensitizing dye onto the surface of the porous film.

In step (a), a paste including metal oxide nanoparticles is coated on the upper surface of a titanium oxide thin film 103 and is calcined to form a 10 nm to 30 μm thick porous film 104.

The paste further includes a binder and a solvent. There is no particular restriction on the method for preparing the paste. The paste may be prepared by any suitable method used in the art. For example, the paste may be prepared in accordance with the following method. First, metal oxide nanoparticles are mixed with a solvent to prepare a colloidal solution having a viscosity of $5 \times 10^4$ to $5 \times 10^5$ cps. The metal oxide nanoparticles are dispersed in the colloidal solution. Then, a binder resin is added to and mixed with the colloidal solution. Finally, the solvent is removed using a distiller. The mixing ratio of the metal oxide nanoparticles, the binder resin, and the solvent is not particularly limited. These components may be mixed in any ratio well known in the art.

The average diameter of the metal oxide nanoparticles is preferably in the range of 10 to 100 nm. Within this range, electrons can easily pass through the metal oxide nanoparticles. The metal oxide nanoparticles may be nanoparticles of at least one metal oxide selected from the group consisting of tin (Sn) oxide, antimony (Sb) oxide, niobium (Nb) oxide, fluorine-doped tin (Sn) oxide, indium (In) oxide, tin-doped indium (In) oxide, zinc (Zn) oxide, aluminum (Al) oxide, boron (B) oxide, gallium (Ga) oxide, hydrogen (H) oxide, yttrium (Y) oxide, titanium (Ti) oxide, silicon (Si)-doped zinc (Zn) oxide, tin (Sn)-doped zinc (Zn) oxide, magnesium (Mg) oxide, cadmium (Cd) oxide, magnesium zinc (MgZn) oxide, indium zinc (InZn) oxide, copper aluminum (CuAl) oxide, silver (Ag) oxide, zinc tin oxide (ZnSnO), zinc indium tin (ZIS) oxide, nickel (Ni) oxide, rhodium (Rh) oxide, ruthenium (Ru) oxide, iridium (Ir) oxide, copper (Cu) oxide, cobalt (Co) oxide, tungsten (W) oxide, zirconium (Zr) oxide, strontium (Sr) oxide, lanthanum (La) oxide, vanadium (V) oxide, molybdenum (Mo) oxide, scandium (Sc) oxide, samarium (Sm) oxide, and strontium titanium (SrTi) oxide.

The binder resin is not particularly limited and may be, for example, selected from the group consisting of polyethylene glycol, polyethylene oxide, polyvinyl alcohol, polyvinylpyrrolidone, ethyl cellulose, and mixtures of two or more thereof.

The solvent is not particularly limited and may be, for example, selected from the group consisting of ethanol, methanol, terpineol, lauric acid, and mixtures of two or more thereof.

The method for coating the paste is not particularly limited and may be, for example, screen printing or doctor blade coating.

The coated paste is calcined at a temperature of 100 to 600° C., preferably 400 to 500° C., for 200 minutes or less, preferably 30 seconds to 30 minutes.

Next, in step (c), the porous film 105 is dipped in the sensitizing dye solution. As a result of the dipping, the sensitizing dye is adsorbed onto the porous film 105.

At least one additive selected from the additives mentioned above may be used in step (b). The porous film 105 is dipped in the sensitizing dye solution at 30 to 50° C. for 1 to 180 minutes.

The sensitizing dye solution is a dispersion of the sensitizing dye in an organic solvent.

The sensitizing dye has a band gap of 1.55 to 3.1 eV. Within this range, the sensitizing dye can absorb visible light. The sensitizing dye may be, for example, selected from the group consisting of an organic-inorganic complex dye, an organic dye, and a mixture thereof. The organic-inorganic complex dye includes a metal or metal complex with an adsorbing group such as a carboxyl group.

The organic-inorganic complex dye may be selected from the group consisting of ruthenium (Ru) complex dyes, osmium (Os) complex dyes, platinum (Pt) complex dyes, copper (Cu) complex dyes, porphyrin complex dyes, and phthalocyanine complex dyes. The organic dye may be selected from the group consisting of coumarin-based organic dyes, indoline-based organic dyes, carbazole-based organic dyes, triarylamine-based organic dyes, perylene-based organic dyes, hemicyanine-based organic dyes, and squaraine-based organic dyes.

The organic solvent is used to dissolve the dye and may be selected from the group consisting of ethanol, acetonitrile, tetrahydrofuran, dimethyl chloride, and mixtures of two or more thereof.

In a working electrode prepared by the method, the dye does not undergo desorption in the long term as well as in the short term. Therefore, the application of the working electrode to a solar cell ensures long-term stability of the solar cell.

The present invention also provides a method for preparing a working electrode of a dye-sensitized solar cell including the dye adsorption method.

The method for preparing a working electrode of a dye-sensitized solar cell according to the present invention includes, prior to step (a), (a') forming a conductive film on one surface of a transparent substrate to obtain a transparent conductive substrate, and (a") coating a titanium oxide precursor on the upper surface of the conductive film, followed by heat treatment to form a titanium oxide thin film.

In step (a'), a conductive film 102 is formed on one surface of a transparent substrate 101 to obtain a transparent conductive substrate (or a transparent conducting oxide (TCO)).

The conductive film 102 may be any of those commonly used in the art. For example, the conductive film 102 may be made of a material selected from the group consisting of fluorine-doped tin oxide (FTO, $SnO_2$:$SnO_2$:F), indium oxide (ITO, $In_2O_3$), metal nitrides, metal oxides, carbon compounds, and conducting polymers. The conductive film 102 may also be a metal electrode with an average thickness of 1 to 1000 nm. Preferably, the conductive film 102 is made of a material selected from the group consisting of FTO ($SnO_2$:$SnO_2$:F), indium oxide (ITO, $In_2O_3$), graphene, and carbon nanotubes.

In step (a"), a titanium oxide precursor is coated on the upper surface of the conductive film 102 and is then heat treated to form a 50 to 250 nm thick titanium oxide thin film 103.

The method for coating the titanium oxide precursor is not particularly limited but is preferably spin coating.

The titanium oxide precursor is heat treated at a high temperature of 100 to 600° C., preferably 400 to 450° C. If the heat treatment temperature is less than the lower limit defined above, the titanium oxide precursor may not be coated in close contact with the conductive film 102, or a porous film may not be readily formed or poor interconnection between titanium oxide nanoparticles may be caused in the subsequent step.

The present invention also provides a dye-sensitized solar cell to including the working electrode. With reference to FIG. 1, an explanation will be given of the dye-sensitized solar cell.

The dye-sensitized solar cell 200 includes a working electrode 100 prepared by the method, a counter electrode 110 arranged to face the working electrode 100 with a certain distance therebetween and including a catalyst layer 111, and an electrolyte 120 filled in a space between the working electrode and the counter electrode. After filling with the electrolyte 120, the space is sealed with a polymer adhesive 130 commonly used in the art to complete fabrication of the dye-sensitized solar cell 200.

The catalyst layer 111 is formed on the upper surface of a transparent conductive substrate including a transparent substrate 101' and a conductive film 102' formed on one surface of the transparent substrate 101'. The catalyst layer 111 may be composed of a material selected from the group consisting of platinum, ruthenium, palladium, conducting polymers, and carbonaceous materials.

Examples of the conducting polymers include poly(3,4-ethylenedioxythiophene)-(poly(styrenesulfonate)) (PEDOT-PSS), polyaniline-CSA, pentacene, polyacetylene, poly(3-hexylthiophene) (P3HT), polysiloxane carbazole, polyaniline, polyethylene oxide, poly(1-methoxy-4-(0-Disperse Red 1)-2,5-phenylene-vinylene), polyindole, polycarbazole, polypyridiazine, polyisothianaphthalene, polyphenylene sulfide, polyvinyl pyridine, polythiophene, polyfluorene, polypyridine, polypyrrole, polysulfur nitride, and copolymers thereof.

Examples of the carbonaceous materials include activated carbon, graphite, carbon nanotubes, carbon black, and grapheme. These carbonaceous materials may be used alone or as a mixture thereof.

Figure 2:
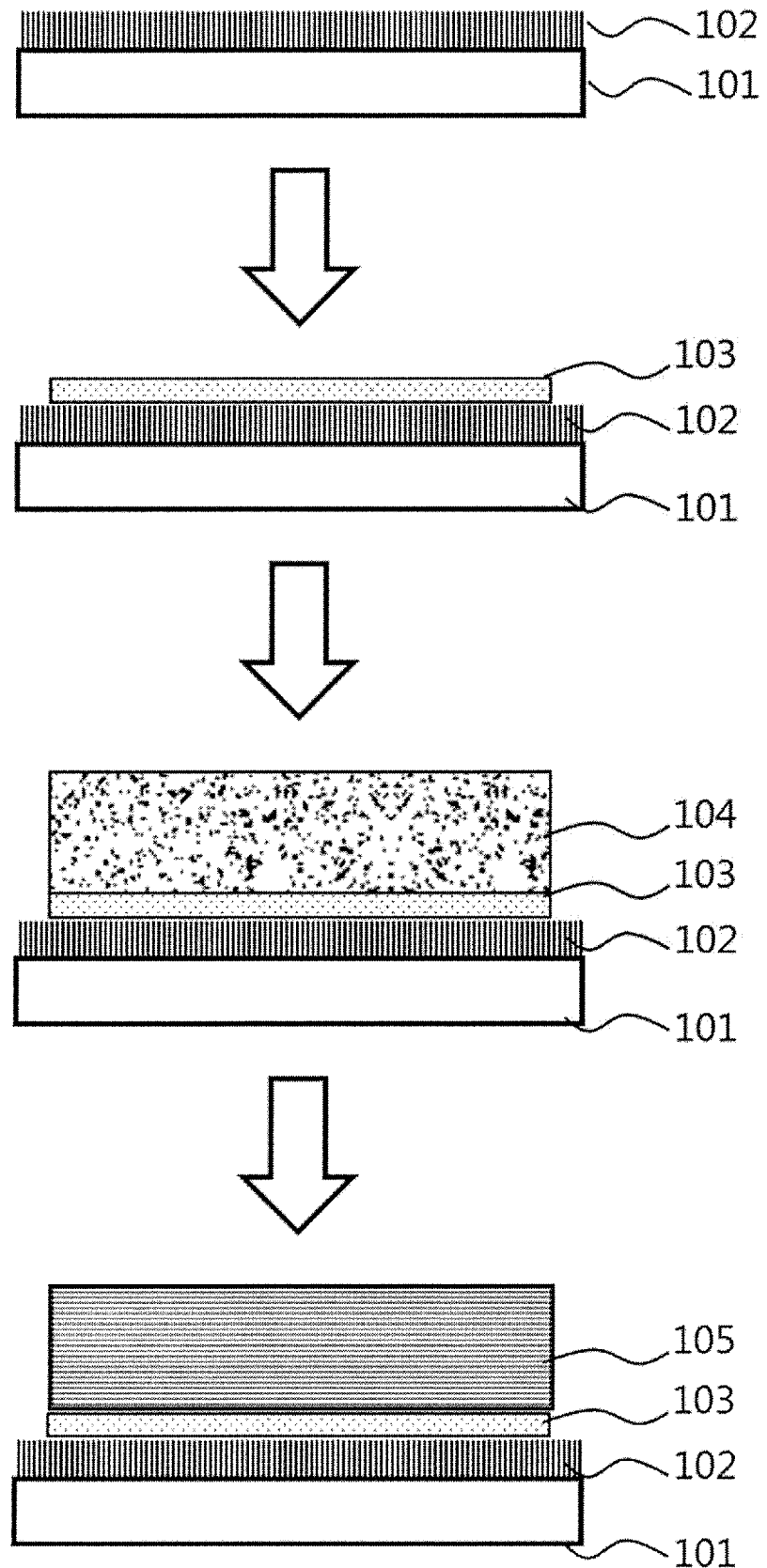
FIG. 2 is a process flow diagram illustrating a method for preparing a working electrode of a dye-sensitized solar cell according to one embodiment of the present invention.

FIG. 1 illustrates a state in which the electrolyte 120 is filled between the working electrode 100 and the counter electrode 110. Alternatively, the electrolyte 120 may be uniformly dispersed between the two electrodes.

The electrolyte 120 is not particularly limited so long as it can be used in dye-sensitized solar cells. The electrolyte 120 includes a redox derivative that plays a role in receiving electrons from the counter electrode 110 by redox reactions and transferring the electrons to the dye of the working electrode 100.

The redox derivative may be selected from the group consisting of iodine (I)-based, bromine (Br)-based, cobalt (Co)-based, thiocyanate (SCN)-based, selenocyanate (SeCN)-based redox derivatives, and mixtures thereof.

The electrolyte may contain at least one polymer selected from the group consisting of polyvinylidene fluoride-co-polyhexafluoropropylene, polyacrylonitrile, polyethylene oxide, and polyalkyl acrylate. The electrolyte may be a polymer gel electrolyte containing silica or $TiO_2$ nanoparticles as inorganic particles.

The present invention will be explained in more detail with reference to the following examples. However, these examples are not to be construed as limiting or restricting the scope and disclosure of the invention. It is to be understood that based on the teachings of the present invention including the following examples, those skilled in the art can readily practice other embodiments of the present invention whose experimental results are not explicitly presented.

EXAMPLES

Example 1

Preparation of Working Electrode 0.15 M titanium diisopropoxide bis(acetylacetonate) (Ti(acac)$_2$OiPr$_2$) was spin coated on a conductive glass substrate (FTO, thickness 2.2 cm, 8 Ω/sq., Philkington) and heat treated at 450° C. to form a 100 nm thick titanium oxide thin film. A paste including 18.5 wt % of titanium oxide nanoparticles having an average diameter of 20 nm, 0.05 wt % of ethyl cellulose as a binder, and the balance of terpineol was applied onto the upper surface of the titanium oxide thin film by doctor blade coating, followed by calcination at 500° C. for 30 min to form a 15 μm thick porous film including the metal oxide nanoparticles.

Meanwhile, 4 mM DPAT was directly dissolved in a 2.0 mM solution of NaRu(4-carboxylic acid-4'-caboxylate)(4,4'-dinonyl-2,2'-bipyridine)(NCS)$_2$) as a sensitizing dye in ethanol. DPAT is an additive necessary to shorten the dye adsorption time. The substrate formed with the porous film was dipped in the sensitizing dye solution containing DPAT at 40° C. for 7 min to prepare a working electrode in which the sensitizing dye was adsorbed onto the porous film surface.

Comparative Example 1

Preparation of Working Electrode

A working electrode was prepared in the same manner as in Example 1, except that the substrate formed with the porous film was dipped in the sensitizing dye solution without the addition of DPAT as the additive.

Comparative Example 2

Preparation of Working Electrode

A working electrode was prepared in the same manner as in Comparative Example 1, except that the substrate formed with the porous film was dipped in the sensitizing dye solution for 240 min instead of 7 min.

Example 2

Fabrication of Solar Cell

A layer of fluorine-doped tin oxide as a transparent conducting oxide was formed on a transparent glass substrate. A solution of hexachloroplatinic acid ($H_2PtCl_6$) in 2-propanol was dropped onto the upper surface of the transparent conducting oxide layer and heat treated at 400° C. for 20 min to form a platinum layer, completing the preparation of a counter electrode as an anode.

An acetonitrile electrolyte including 1-methyl-3-propy-limidazolium iodide (PMII, 0.7 M) and $I_2$ (0.03 M) was injected into a space between the counter electrode and the working electrode prepared in Example 1, and sealed with a polymer adhesive to fabricate a dye-sensitized solar cell.

Comparative Example 3

A dye-sensitized solar cell was fabricated in the same manner as in Example 2, except that the working electrode prepared in Comparative Example 1 was used instead of the working electrode prepared in Example 1.

Comparative Example 4

A dye-sensitized solar cell was fabricated in the same manner as in Example 2, except that the working electrode prepared in Comparative Example 2, which was designed to reach a saturation photocurrent, was used instead of the working electrode prepared in Example 1.

Test Example 1

Measurement of Open Circuit Voltages, Photocurrent Densities, Energy Conversion Efficiencies and Fill Factors of the Dye-sensitized Solar Cells The open circuit voltages, photocurrent densities, energy conversion efficiencies, and fill factors of the dye-sensitized solar cells fabricated in Example 2 and Comparative Example 3 were measured by the following methods. The results are shown in Table 1.

1. The open circuit voltages (V) were measured using a source meter unit (Keithley SMU2400).

2. The photocurrent densities (mA/cm$^2$) were measured using a source meter unit (Keithley SMU2400).

3. The energy conversion efficiencies (%) were measured using an AM1.5 100 mW/cm$^2$ solar simulator consisting of a Xe lamp (1600 W, YAMASHITA DENSO), an AM1.5 filter and Keithley SMU2400.

4. The fill factors (%) were calculated by Equation 1:

$$\text{Fill factor (\%)} = \frac{(J \times V)_{max}}{J_{sc} \times V_{oc}} \times 100 \quad (1)$$

where J and V are Y-axis and X-axis values of an energy conversion efficiency curve, respectively, and $J_{sc}$ and $V_{oc}$ are values of the Y-axis and X-axis intercepts, respectively.

TABLE 1

| Characteristics | Current density (mA/cm$^2$) | Open circuit voltage (V) | Fill factor (%) | Energy conversion efficiency (%) |
|---|---|---|---|---|
| Example 2 | 14.921 | 0.781 | 0.727 | 8.472 |
| Comparative Example 3 | 11.714 | 0.817 | 0.758 | 7.257 |

As can be seen from the results in Table 1, the current density and energy conversion efficiency of the dye-sensitized solar cell fabricated in Example 2 were higher than those of the dye-sensitized solar cell fabricated in Comparative Example 3. The working electrodes of the two dye-sensitized solar cells were adsorbed by the dye for the same time.

Test Example 2

Figure 3:
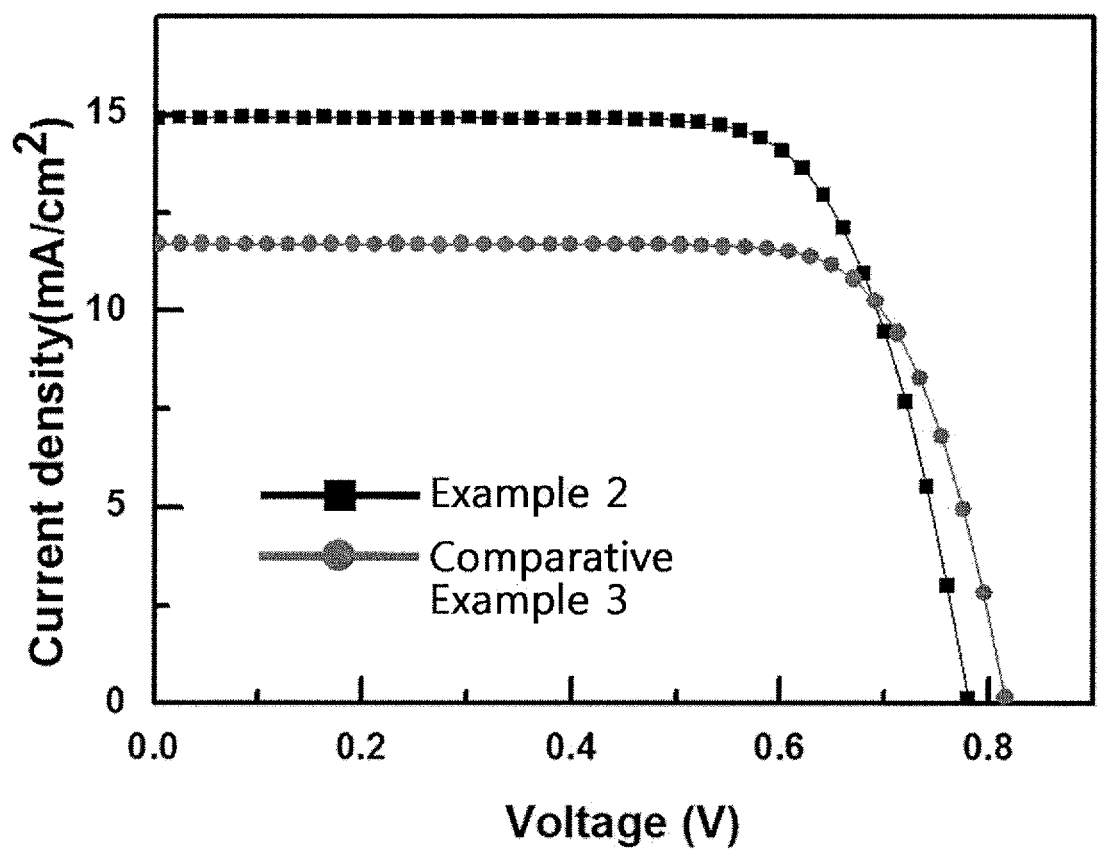
FIG. 3 shows current-voltage curves of dye-sensitized solar cells fabricated in Example 2 and Comparative Example 3.

Measurement of Current-voltage Characteristics of the Dye-sensitized Solar Cells FIG. 3 shows current-voltage curves measured for the dye-sensitized solar cells fabricated in Example 2 and Comparative Example 3 under AM 1.5 G and 1 SUN conditions. From FIG. 3, the dye-sensitized solar cell of Example 2 was found to have higher photocurrent values than Comparative Example 3.

Test Example 3

Measurement of Photocurrent Densities of the Dye-sensitized Solar Cells

The open circuit voltages, photocurrent densities, energy conversion efficiencies, and fill factors of the dye-sensitized solar cells fabricated in Example 2 and Comparative Example 4 were measured and the results are shown in Table 2.

TABLE 2

| Characteristics | Current density (mA/cm$^2$) | Open circuit voltage (V) | Fill factor (%) | Energy conversion efficiency (%) |
|---|---|---|---|---|
| Example 2 | 14.921 | 0.781 | 0.727 | 8.472 |
| Comparative Example 4 | 14.859 | 0.786 | 0.727 | 8.484 |

As can be seen from the results in Table 2, the current density and energy conversion efficiency of the dye-sensitized solar cell fabricated in Example 2 were similar to those of the dye-sensitized solar cell fabricated in Comparative Example 4. The working electrode of the dye-sensitized solar cell fabricated in Comparative Example 4 was adsorbed by the dye for the same time as that of a general dye-sensitized solar cell. These results indicate that despite faster adsorption of the sensitizing dye onto the working electrode used in the dye-sensitized solar cell of Example 2, the dye was stably adsorbed without loss of photocurrent.

Solar cells were fabricated in the same manner as in the above examples, except that mixtures of diphenylammonium trifluoromethanesulfonate (DPAT) and pentafluoroanilinium triflate (PFPAT) in a weight ratio of 1-99:99-1 were used in the same amount as described in Example 1 and the processing conditions (for example, the thickness and sheet resistance of the conductive glass substrate, the kind and concentration of the titanium oxide, the heat treatment temperature for the formation of the titanium oxide thin film, the thickness of the titanium oxide thin film, the average diameter and content of the titanium oxide nanoparticles in the paste, the calcining temperature and time for the formation of the porous film, and the dipping time and temperature for the adsorption of the sensitizing dye) were changed within the range of 1% to 10%. As a result, it was confirmed that the performance characteristics of the solar cells were uniform within 1%. Details of the experimental results are not presented herein.

Experiments were conducted in the same manner as in Example 1, except that the additive was used at 1.1- and 15-fold higher molar concentrations than the sensitizing dye. As a result, the rates of desorption of the dye were lowered, leading to an improvement in stability (by ~1.3 and ~1.2 times, respectively). However, the stability was significantly improved (by at least ~10 times) when the molar concentration of the additive was 2 times higher than that of the sensitizing dye. Details of the experimental results are not presented herein.

Particularly, the rates of desorption of the dye were investigated after operation at 50° C. or higher for 300 hr. As a result, the rates of desorption of the dye increased slightly when the additive was used at 1.1- and 15-fold higher molar concentrations than the sensitizing dye, whereas there was no change in the rate of desorption of the dye when the molar concentration of the additive was 2 times higher than that of the sensitizing dye, demonstrating greatly improved high-temperature long-term stability.

What is claimed is:

1. A sensitizing dye solution for the preparation of a working electrode of a dye-sensitized solar cell, comprising a sensitizing dye, an organic solvent, and an additive wherein the additive is a mixture of (i) a first additive selected from diphenylammonium trifluoromethanesulfonate (DPAT), pentafluoroanilinium triflate (PFPAT), pentafluorophenylammonium trifluoromethanesulfonate, N-(trimethylsilyl)bis(trifluoromethanesulfonyl)imide, 4-methylbenzenesulfonic acid, (7,7-dimethyl-2-oxobicyclo[2,2,1]-hept-1-yl)methanesulfonic acid, and mixtures of two or more thereof, and (ii) a second additive selected from hydrochloric acid, phosphoric acid, acetic acid, nitric acid, and mixtures of two or more thereof, wherein the contents of the first additive and the second additive are from 1.5 to 10 moles and from 1.5 to 10 moles, respectively, based on one mole of the sensitizing dye, and the molar ratio of the first additive to the second additive is from 99:1 to 80:20 wherein the additive improves the rate of adsorption of the sensitizing dye to titanium oxide.

2. The sensitizing dye solution according to claim 1, wherein the sensitizing dye has a band gap of 1.55 to 3.1 eV.

3. The sensitizing dye solution according to claim 1, wherein the sensitizing dye is selected from an organic-inorganic complex dye comprising a metal or metal complex, an organic dye, and a mixture thereof.

4. The sensitizing dye solution according to claim 3, wherein the organic-inorganic complex dye is selected from ruthenium (Ru) complex dyes, osmium (Os) complex dyes, platinum (Pt) complex dyes, copper (Cu) complex dyes, porphyrin complex dyes, phthalocyanine complex dyes, and mixtures of two or more thereof.

5. The sensitizing dye solution according to claim 3, wherein the organic dye is selected from coumarin-based organic dyes, indoline-based organic dyes, carbazole-based organic dyes, triarylamine-based organic dyes, perylene-based organic dyes, hemicyanine-based organic dyes, squaraine-based organic dyes, and mixtures of two or more thereof.

6. The sensitizing dye solution according to claim 1, wherein the organic solvent is selected from ethanol, acetonitrile, tetrahydrofuran, dimethyl chloride, and mixtures of two or more thereof.

7. A method for preparing a working electrode of a dye-sensitized solar cell, the method comprising (C) bringing the sensitizing dye solution according to claim 1 into contact with a porous substrate wherein the porous substrate comprises a titanium oxide thin film and a 10 nm to 30 µm thick porous film formed on the upper surface of the titanium oxide thin film.

8. A method for preparing a working electrode of a dye-sensitized solar cell, the method comprising (B) forming a porous film on the upper surface of a titanium oxide thin film formed on a transparent conductive substrate to obtain a porous substrate, and (C) bringing the sensitizing dye solution according to claim 1 into contact with the porous substrate.

9. A method for preparing a working electrode of a dye-sensitized solar cell, the method comprising (A) forming a titanium oxide thin film on a transparent conductive substrate, (B) forming a porous film on the upper surface of the titanium oxide thin film to obtain a porous substrate, and (C) bringing the sensitizing dye solution according to claim 1 into contact with the porous substrate.

10. The method according to claim 9, wherein step (A) is carried out by (i) coating a titanium oxide precursor on a transparent conductive substrate, followed by heat treatment, or (ii) forming a conductive film on one surface of a transparent substrate, coating a titanium oxide precursor on the conductive film, followed by heat treatment.

11. The method according to claim 10, wherein the heat treatment is performed at 100 to 600° C.

12. The method according to claim 8, wherein the titanium oxide thin film is from 50 to 250 nm in thickness.

13. The method according to claim 8, wherein step (B) is carried out by coating a paste comprising metal oxide nanoparticles on the upper surface of the titanium oxide thin film and calcining the coated paste.

14. The method according to claim 13, wherein the metal oxide is selected from tin (Sn) oxide, antimony (Sb) oxide, niobium (Nb) oxide, fluorine-doped tin (Sn) oxide, indium (In) oxide, tin-doped indium (In) oxide, zinc (Zn) oxide, aluminum (Al) oxide, boron (B) oxide, gallium (Ga) oxide, hydrogen (H) oxide, yttrium (Y) oxide, titanium (Ti) oxide, silicon (Si)-doped zinc (Zn) oxide, tin (Sn)-doped zinc (Zn) oxide, magnesium (Mg) oxide, cadmium (Cd) oxide, magnesium zinc (MgZn) oxide, indium zinc (InZn) oxide, copper aluminum (CuAl) oxide, silver (Ag) oxide, zinc tin oxide (ZnSnO), zinc indium tin (ZIS) oxide, nickel (Ni) oxide, rhodium (Rh) oxide, ruthenium (Ru) oxide, iridium (Ir) oxide, copper (Cu) oxide, cobalt (Co) oxide, tungsten (W) oxide, zirconium (Zr) oxide, strontium (Sr) oxide, lanthanum (La) oxide, vanadium (V) oxide, molybdenum (Mo) oxide, scandium (Sc) oxide, samarium (Sm) oxide, strontium titanium (SrTi) oxide, and mixtures of two or more thereof.

15. The method according to claim 13, wherein the metal oxide nanoparticles have an average particle diameter of 10 to 100 nm.

16. The method according to claim 13, wherein the paste further comprises a binder and a solvent.

17. The method according to claim 7, wherein the calcination is performed at 100 to 600° C. for 30 to 200 minutes.

18. The method according to claim 7, wherein the porous film has a thickness of 10 nm to 30 µm.

19. The method according to claim 7, wherein step (C) is carried out by (i) dipping the porous substrate in the sensitizing dye solution, (ii) spraying the sensitizing dye solution on the porous substrate, or (iii) dropping the sensitizing dye solution onto the porous substrate.

20. The method according to claim 19, wherein the porous film is dipped in the sensitizing dye solution at 30 to 50° C. for 1 to 180 minutes.

21. A working electrode for a dye-sensitized solar cell prepared by the method according to claim 7.

22. A dye-sensitized solar cell comprising (a) a working electrode prepared by the method according to claim 7, (b) a counter electrode arranged to face the working electrode and comprising a catalyst layer, and (c) an electrolyte filled between the working electrode and the counter electrode.

\* \* \* \* \*